(12) United States Patent
Purayath et al.

(10) Patent No.: US 9,177,808 B2
(45) Date of Patent: Nov. 3, 2015

(54) MEMORY DEVICE WITH CONTROL GATE OXYGEN DIFFUSION CONTROL AND METHOD OF MAKING THEREOF

(71) Applicant: SANDISK TECHNOLOGIES, INC., Plano, TX (US)

(72) Inventors: Vinod R. Purayath, Santa Clara, CA (US); James Kai, Santa Clara, CA (US); Donovan Lee, Santa Clara, CA (US); Akira Matsudaira, San Jose, CA (US); Yuan Zhang, San Jose, CA (US)

(73) Assignee: SANDISK TECHNOLOGIES INC., Plano, TX (US)

( * ) Notice: Subject to any disclaimer, the term of this patent is extended or adjusted under 35 U.S.C. 154(b) by 0 days.

(21) Appl. No.: 14/284,917

(22) Filed: May 22, 2014

(65) Prior Publication Data
US 2014/0346584 A1    Nov. 27, 2014

Related U.S. Application Data

(60) Provisional application No. 61/825,866, filed on May 21, 2013.

(51) Int. Cl.
| | | |
|---|---|---|
| *H01L 27/115* | (2006.01) | |
| *H01L 21/28* | (2006.01) | |
| *H01L 29/423* | (2006.01) | |
| *H01L 29/51* | (2006.01) | |
| *H01L 29/788* | (2006.01) | |
| *H01L 29/792* | (2006.01) | |

(52) U.S. Cl.
CPC .... *H01L 21/28273* (2013.01); *H01L 21/28282* (2013.01); *H01L 29/4234* (2013.01); *H01L 29/42324* (2013.01); *H01L 29/513* (2013.01); *H01L 29/7881* (2013.01); *H01L 29/792* (2013.01); *H01L 27/1157* (2013.01); *H01L 27/11524* (2013.01)

(58) Field of Classification Search
CPC ............... H01L 27/11582; H01L 27/11578; H01L 27/11556; H01L 27/11524; H01L 27/11551
See application file for complete search history.

(56) References Cited

U.S. PATENT DOCUMENTS

| | | |
|---|---|---|
| 5,570,315 A | 10/1996 | Tanaka et al. |
| 5,714,766 A | 2/1998 | Chen et al. |
| 5,774,397 A | 6/1998 | Endoh et al. |

(Continued)

FOREIGN PATENT DOCUMENTS

DE    10 2008 009365 A1    10/2008

OTHER PUBLICATIONS

Chan et al., "A True Single-Transistor Oxide-Nitride-Oxide EEPROM Device," IEEE Electron Device Letters, vol. EDL-8, No. 3, Mar. 1987, pp. 93-95.

(Continued)

*Primary Examiner* — John C Ingham
(74) *Attorney, Agent, or Firm* — The Marbury Law Group PLLC

(57) ABSTRACT

An embodiment relates to a memory device that includes a semiconductor channel, a tunnel dielectric located over the semiconductor channel, a charge storage region located over the tunnel dielectric, a blocking dielectric located over the charge storage region, and a control gate located over the blocking dielectric. An interface between the blocking dielectric and the control gate substantially prevents oxygen diffusion from the blocking dielectric into the control gate.

20 Claims, 14 Drawing Sheets

(56) References Cited

U.S. PATENT DOCUMENTS

| | | |
|---|---|---|
| 6,015,738 A | 1/2000 | Levy et al. |
| 6,046,935 A | 4/2000 | Takeuchi et al. |
| 6,208,000 B1 | 3/2001 | Tanamoto et al. |
| 6,297,095 B1 | 10/2001 | Muralidhar et al. |
| 6,407,424 B2 | 6/2002 | Forbes |
| 6,646,302 B2 | 11/2003 | Kan et al. |
| 6,656,792 B2 | 12/2003 | Choi et al. |
| 6,859,397 B2 | 2/2005 | Lutze et al. |
| 6,881,994 B2 | 4/2005 | Lee et al. |
| 6,913,984 B2 | 7/2005 | Kim et al. |
| 6,917,542 B2 | 7/2005 | Chen et al. |
| 6,927,136 B2 | 8/2005 | Lung et al. |
| 6,991,984 B2 | 1/2006 | Ingersoll et al. |
| 7,045,851 B2 | 5/2006 | Black et al. |
| 7,119,395 B2 | 10/2006 | Gutsche et al. |
| 7,138,680 B2 | 11/2006 | Li et al. |
| 7,173,304 B2 | 2/2007 | Weimer et al. |
| 7,259,984 B2 | 8/2007 | Kan et al. |
| 7,649,779 B2 | 1/2010 | Ruttkowski et al. |
| 7,723,186 B2 | 5/2010 | Purayath et al. |
| 8,193,055 B1 | 6/2012 | Purayath et al. |
| 8,754,466 B2 * | 6/2014 | Yun et al. ............. 257/324 |
| 8,778,762 B2 * | 7/2014 | Keshav et al. ............. 438/268 |
| 2004/0026682 A1 | 2/2004 | Jiang |
| 2004/0094794 A1 | 5/2004 | Wu |
| 2004/0130941 A1 | 7/2004 | Kan et al. |
| 2004/0180491 A1 | 9/2004 | Arai et al. |
| 2004/0256662 A1 | 12/2004 | Black et al. |
| 2005/0112820 A1 | 5/2005 | Chen et al. |
| 2005/0122775 A1 | 6/2005 | Koyanagi et al. |
| 2005/0258470 A1 | 11/2005 | Lojek et al. |
| 2005/0287717 A1 | 12/2005 | Heald et al. |
| 2006/0250836 A1 | 11/2006 | Herner et al. |
| 2006/0250837 A1 | 11/2006 | Herner et al. |
| 2007/0045604 A1 | 3/2007 | Liu et al. |
| 2007/0158736 A1 | 7/2007 | Arai et al. |
| 2008/0026532 A1 | 1/2008 | Duan et al. |
| 2008/0237692 A1 | 10/2008 | Lee et al. |
| 2008/0242011 A1 | 10/2008 | Song et al. |
| 2009/0001345 A1 | 1/2009 | Schricker et al. |
| 2009/0014704 A1 | 1/2009 | Chen et al. |
| 2009/0027944 A1 | 1/2009 | Ufert |
| 2009/0097320 A1 | 4/2009 | Min et al. |
| 2009/0117697 A1 | 5/2009 | Park et al. |
| 2009/0134444 A1 | 5/2009 | Hanafi |
| 2009/0146140 A1 | 6/2009 | Kim et al. |
| 2009/0155967 A1 | 6/2009 | Purayath et al. |
| 2009/0168491 A1 | 7/2009 | Schricker et al. |
| 2010/0008128 A1 | 1/2010 | Yoshii et al. |
| 2011/0020992 A1 | 1/2011 | Purayath et al. |
| 2011/0147337 A1 | 6/2011 | Lee |
| 2011/0186799 A1 | 8/2011 | Kai et al. |
| 2011/0286275 A1 * | 11/2011 | Jeon et al. ............. 365/185.17 |
| 2013/0105881 A1 | 5/2013 | Kai et al. |
| 2013/0175604 A1 * | 7/2013 | Polishchuk et al. ............. 257/325 |
| 2014/0001535 A1 | 1/2014 | Purayath et al. |
| 2014/0001553 A1 | 1/2014 | Purayath et al. |
| 2014/0160841 A1 * | 6/2014 | Koval ............. 365/185.01 |

OTHER PUBLICATIONS

Nozaki et al., "A 1-Mb EEPROM with MONOS Memory Cell for Semiconductor Disk Application," EEE Journal of Solid-State Circuits, vol. 26, No. 4, Apr. 1991, pp. 497-501.

Komatsu et al., "Applying Nanotechnology to Electronics," Science & Technology Trends, Quarterly Review No. 16, Jul. 2005, pp. 36-45.

Guarini et al., "Low Voltage, Scalable Nanocrystal Flash Memory Fabricated by Templated Self-Assembly," IEEE Int. Electron Devices Meeting Tech. Diges, vol. 22, No. 2, Dec. 2003, pp. 1-4.

Haryono et al., "Controlled Arragement of Nanoparticle Arrays in Block-Copolymer Domains," Small.2.5 (2006), pp. 600-611.

Takeuchi et al., "Molybdenum-Gate $HfO_2$ CMOS FinFET Technology," Electron Device Letters, IEEE 29, No. 6 (2008), pp. 618-620.

U.S. Appl. No. 61/667,007, V. Purayath et al., "NAND Memory Device Containing Nanodots," filed Jul. 2, 2012.

U.S. Appl. No. 13/690,054, V. Purayath et al., "Select Gate Formation for Nanodot Flat Cell," filed Nov. 30, 2012.

* cited by examiner

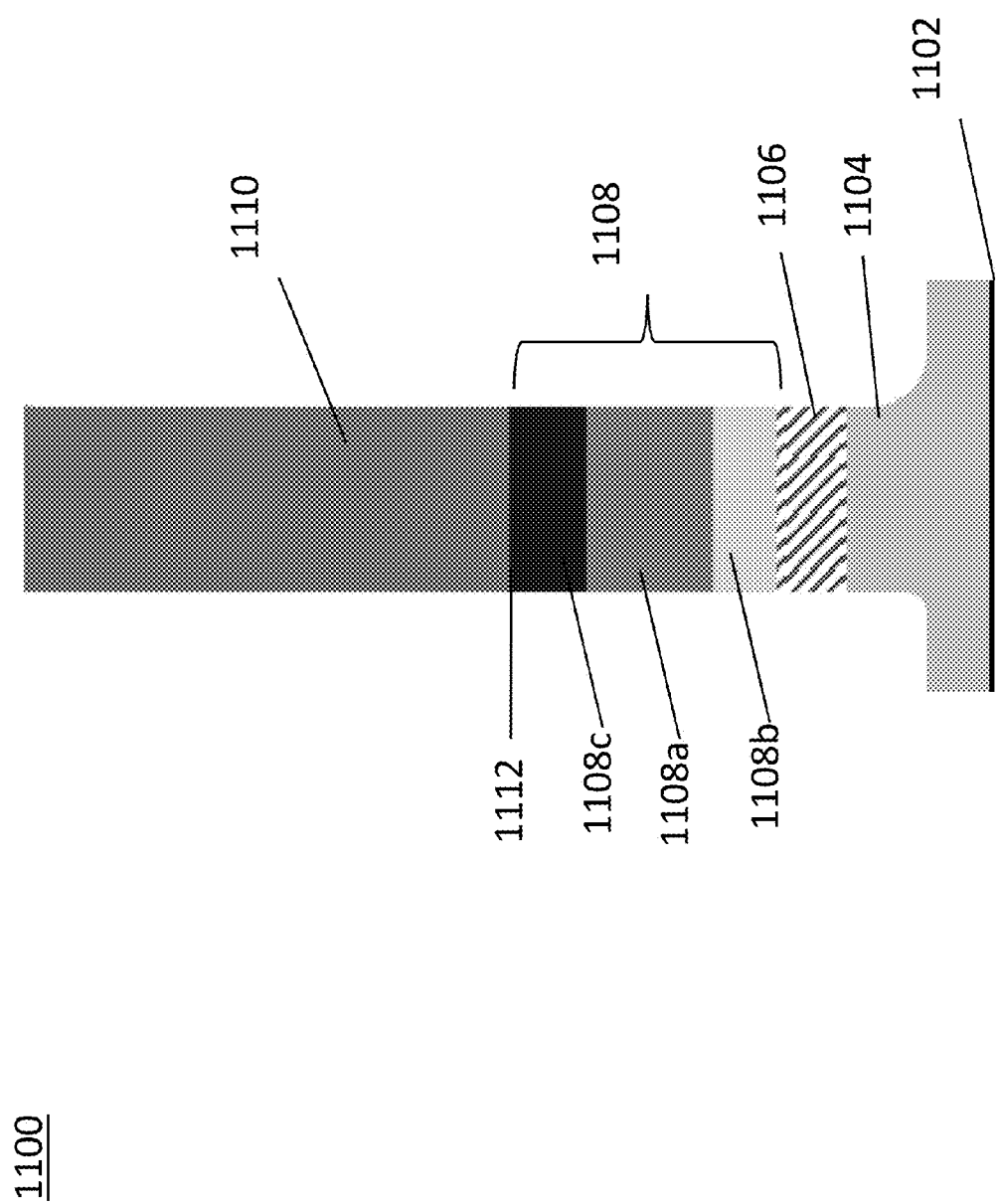

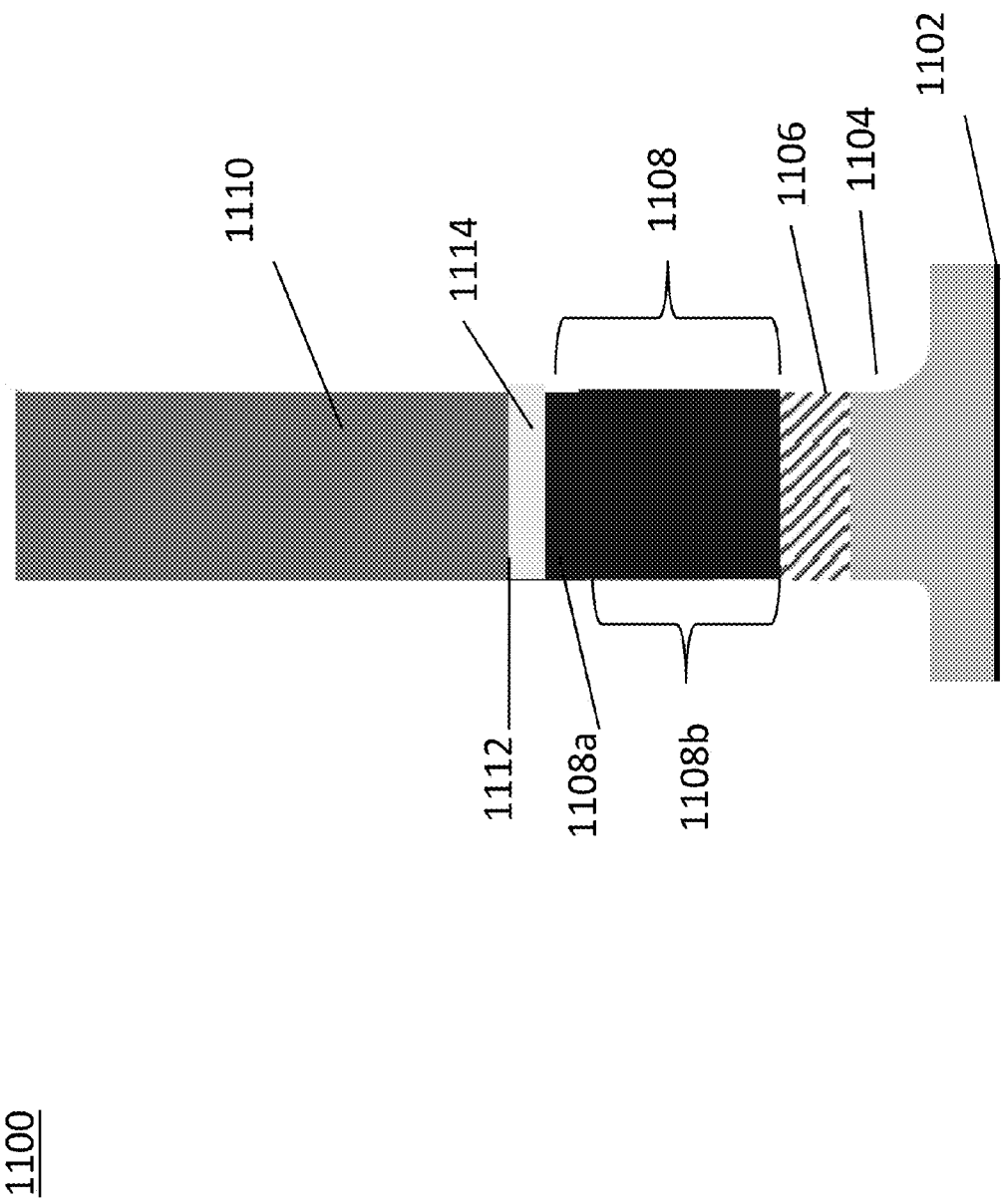

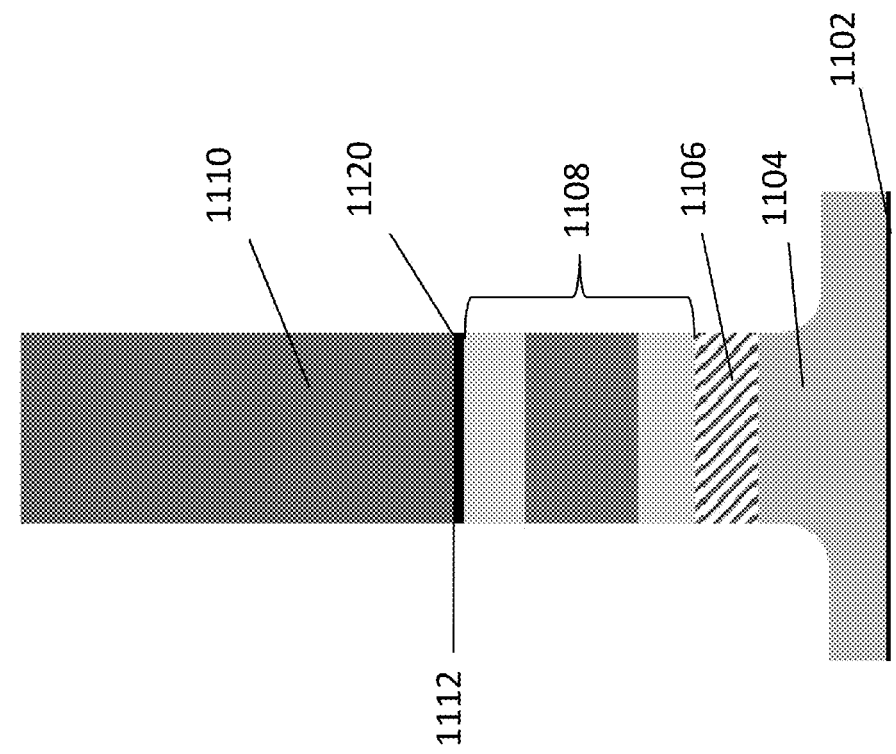

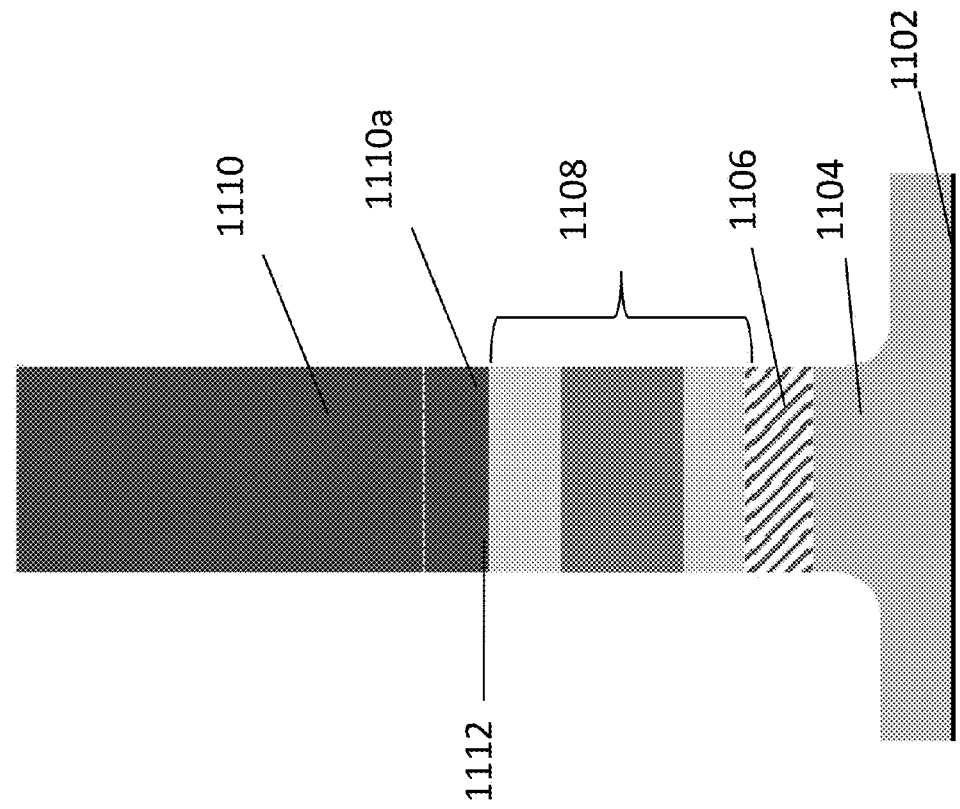

1104

3301

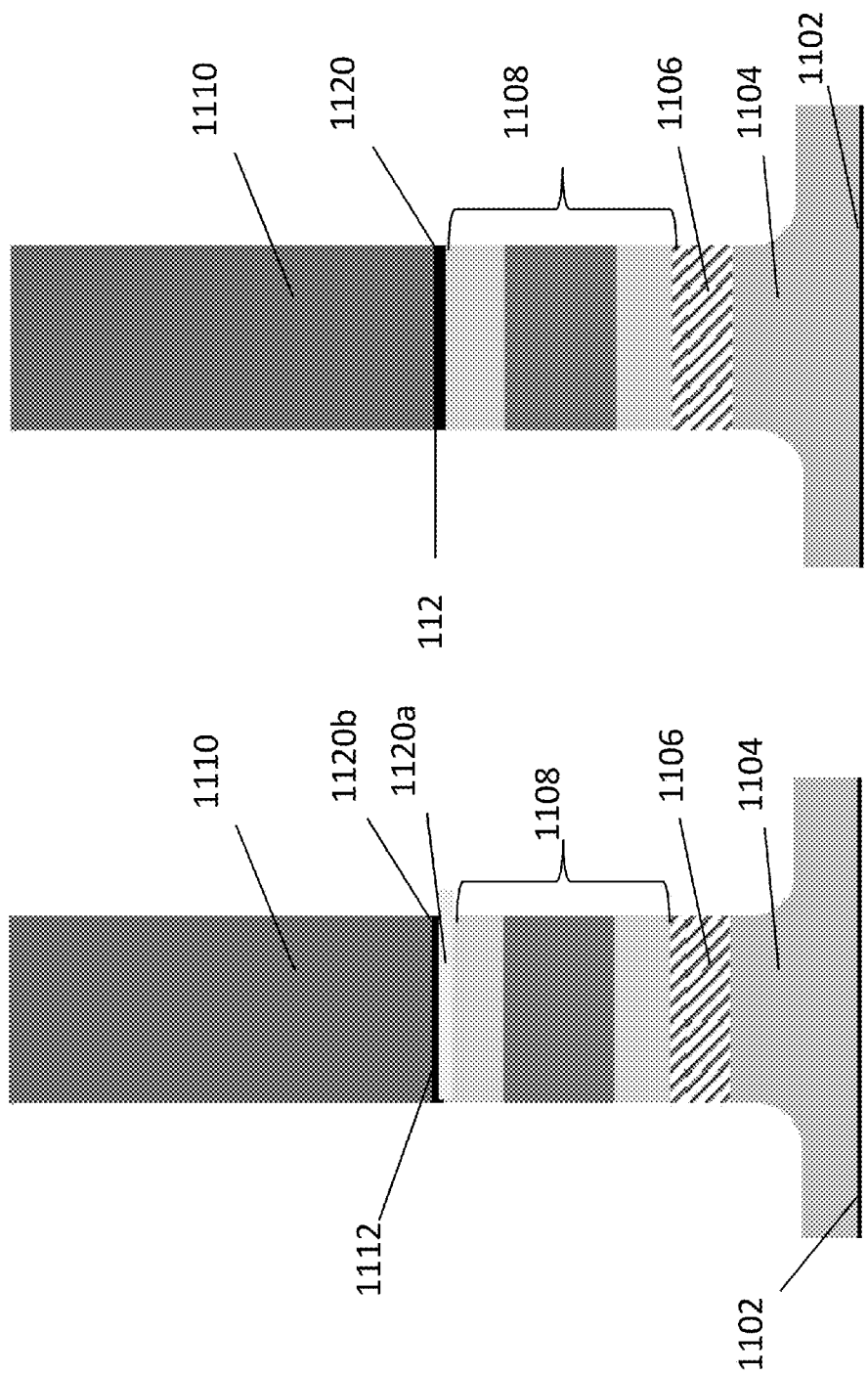

MEMORY DEVICE WITH CONTROL GATE OXYGEN DIFFUSION CONTROL AND METHOD OF MAKING THEREOF

CROSS REFERENCE TO RELATED APPLICATIONS

The present application claims the benefit of U.S. Provisional Patent Application Ser. No. 61/825,866 filed May 21, 2013, the entire contents of which are incorporated herein by reference.

FIELD

The present invention relates generally to the field of semiconductor devices and specifically to non-volatile memory devices and methods of making thereof.

BACKGROUND

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage ($V_{TH}$) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Typically, a program voltage $V_{PGM}$ applied to the control gate during a program operation is applied as a series of pulses that increase in magnitude over time. In one possible approach, the magnitude of the pulses is increased with each successive pulse by a predetermined step size, e.g., 0.2-0.4 V $V_{PGM}$ can be applied to the control gates of flash memory elements. In the periods between the program pulses, verify operations are carried out. That is, the programming level of each element of a group of elements being programmed in parallel is read between successive programming pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

Moreover, when programming an EEPROM or flash memory device, such as a NAND flash memory device in a NAND string, typically VPGM is applied to the control gate and the bit line is grounded, causing electrons from the channel of a cell or memory element, e.g., storage element, to be injected into the floating gate. When electrons accumulate in the floating gate, the floating gate becomes negatively charged and the threshold voltage of the memory element is raised so that the memory element is considered to be in a programmed state. More information about such programming can be found in U.S. Pat. No. 6,859,397, titled "Source Side Self Boosting Technique For Non-Volatile Memory," and in U.S. Pat. No. 6,917,542, titled "Detecting Over Programmed Memory," issued Jul. 12, 2005; both of which are incorporated herein by reference in their entirety.

SUMMARY

One embodiment relates to a memory device, the device including: a semiconductor channel; a tunnel dielectric located over the semiconductor channel; a charge storage region located over the tunnel dielectric; a blocking dielectric located over the charge storage region; and a control gate located over the blocking dielectric. An interface between the blocking dielectric and the control gate substantially prevents oxygen diffusion from the blocking dielectric into the control gate.

In some embodiments, the blocking dielectric contains at least one metal oxide layer below the interface.

In some embodiments, molybdenum, a molybdenum alloy, a noble metal or a noble metal alloy is located at the interface between the blocking dielectric and the control gate. In some embodiments, the control gate comprises a molybdenum control gate; and the molybdenum located at the interface between the blocking dielectric and the control gate comprises a bottom of the control gate.

Some embodiments may include a barrier layer (e.g., an oxynitride layer) located at the interface between the blocking dielectric and the control gate.

Another embodiment relates to a method of making a memory device, the method comprising: forming a tunnel dielectric over a semiconductor channel; forming a charge storage region over the tunnel dielectric; forming a blocking dielectric over the charge storage region; and forming a control gate over the blocking dielectric. An interface between the blocking dielectric and the control gate substantially prevents oxygen diffusion from the blocking dielectric into the control gate.

In some embodiments, the blocking dielectric contains at least one metal oxide layer below the interface.

In some embodiments, a molybdenum alloy, a noble metal or a noble metal alloy is located at the interface between the blocking dielectric and the control gate. In some embodiments, the control gate comprises a molybdenum control gate; and the molybdenum located at the interface between the blocking dielectric and the control gate comprises a bottom of the control gate.

Some embodiments may include a barrier layer (e.g., an oxynitride layer) located at the interface between the blocking dielectric and the control gate.

Another embodiment relates to a NAND string that includes: a semiconductor channel; a tunnel dielectric located over the semiconductor channel; a charge storage region located over the tunnel dielectric; a metal oxide blocking dielectric located over the charge storage region; and a barrier layer comprising titanium silicide nitride or hafnium oxynitride located over the blocking dielectric; and a control gate located over the barrier layer.

BRIEF DESCRIPTION OF THE DRAWINGS

FIGS. 1A-1E are side cross sectional views of memory devices of alternative embodiments of the invention.

FIGS. 3A-3F are side cross sectional views of an in-process memory device during steps in a fabrication process of the memory devices of alternative embodiments of the invention.

DETAILED DESCRIPTION

Embodiments of the present invention will be described below with reference to the accompanying drawings. It should be understood that the following description is intended to describe exemplary embodiments of the invention, and not to limit the invention.

FIGS. 1A, 1B, 1C, 1D, and 1E each show an exemplary embodiment of a memory device 1100, such as a single memory cell of a NAND string. The memory device 1100 includes a semiconductor channel 1102, a tunnel dielectric 1104 located over the semiconductor channel 1102, a charge storage region 1106 (e.g., a floating gate or charge trapping dielectric) located over the tunnel dielectric 1104, a blocking dielectric 1108 located over the charge storage region 1106, and a control gate 1110 located over the blocking dielectric 1108. An interface 1112 is formed between the blocking dielectric 1108 and the control gate 1110 which substantially prevents oxygen diffusion from the oxide blocking dielectric 1108 into the control gate 1110. An interface which substantially prevents oxygen diffusion includes an interface which prevents all oxygen diffusion into the control gate, such that no oxygen diffuses into the control gate or an interface which prevents at least 90 percent of oxygen diffusion into the control gate from the blocking dielectric. In other words, the control gate with the interface 1112 has at least 90 percent less diffused oxygen from the blocking dielectric than a control gate which lacks such interface.

Figure 6:
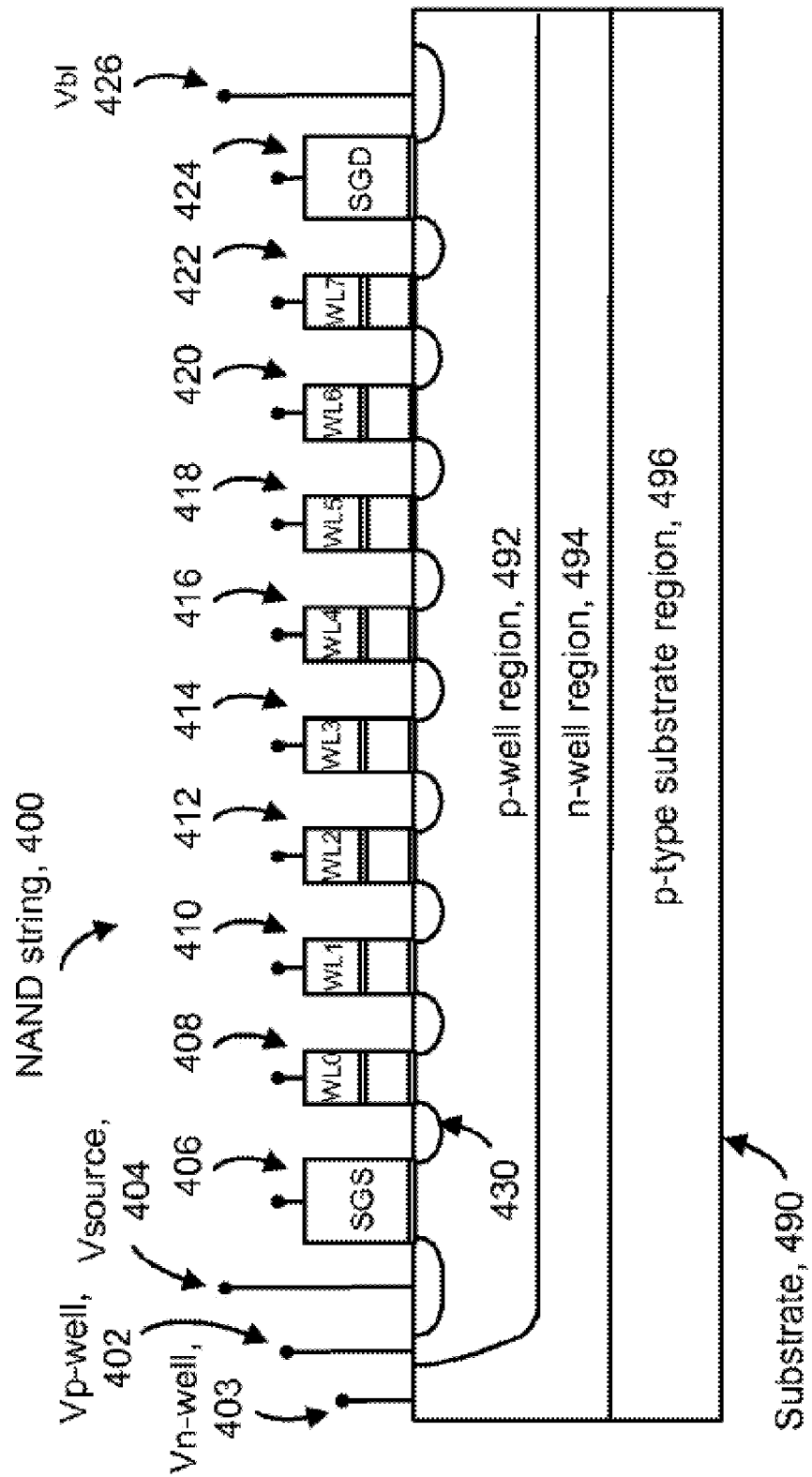
FIG. 6 is a side cross sectional view of a NAND string device on a substrate.

In some embodiments, the semiconductor channel 1102 may include any suitable type of semiconductor material, such as silicon, germanium, silicon-germanium or compound semiconductor material (e.g., III-V semiconductor material). In some embodiments the semiconductor channel 1102 may include a region of doped semiconductor material of a first conductivity type disposed between source and drain regions (not shown) of semiconductor material having a second conductivity type that differs from the first. For example, the semiconductor channel 1102 may be n-type doped semiconductor while the source and drain regions are p-type semiconductor material (or vice versa). In some embodiments, the semiconductor channel 1102 may be formed in a substrate, such as a silicon wafer substrate (e.g., as shown in FIG. 6 and as described below). Alternatively, the channel 1102 may be a semiconductor layer or thin film that is located above a semiconductor or non-semiconductor substrate.

The tunnel dielectric 1104 may be formed from any suitable insulating material, such as an oxide. For example, in some embodiments, the tunnel dielectric 1104 may include a silicon oxide (e.g., $SiO_2$) layer, a nitrided silicon oxide layer or a plurality of insulating layers (e.g., silicon oxide and silicon nitride layers). In some embodiments the tunnel dielectric 1104 has a thickness selected to allow for quantum tunneling of charge carriers (e.g., Fowler-Nordheim tunneling or hot carrier injection) between the charge storage region 1016 and the semiconductor channel 1102 (e.g., in the presence of an applied electric field) to allow for programming and erasing the memory device 1100.

The charge storage region 1106 may include any suitable charge storage material. For example, in some embodiments, the charge storage region 1106 includes polycrystalline silicon, metal (e.g., tungsten or ruthenium), metal silicide or insulating material (e.g., silicon nitride). In some embodiments, the charge storage region 1106 may operate as a floating gate for the memory device 1100. As noted above, in some embodiments, the charge storage state of the charge storage region 1106 may be programmed by applying an electric field to the region to cause tunneling of charge carriers into or out of the charge storage region 1106.

The blocking dielectric 1108 may be any suitable material that electrically insulates the charge storage region 1106 from the control gate 1110. As described in more detail below, the blocking dielectric 1108 may include layers of one or more oxide, such as metal oxide layers (e.g., $HfO_2$ and/or $Al_2O_3$ layers).

The control gate 1110 may include an electrically conductive material (e.g., a metal, metal alloy, or metal silicide) in contact with the blocking dielectric 1108 at the interface 1112. In some embodiments, the control gate 1110 may include for example, tungsten, a tungsten alloy, molybdenum, a molybdenum alloy, a noble metal or a noble metal alloy.

As detailed below with reference to FIG. 1E, the control gate 1110 may include molybdenum, a molybdenum alloy, a noble metal or a noble metal alloy located at the interface 1112 between the blocking dielectric 1108 and the control gate 110. In some embodiments, the portion of the control gate 1110 extending away from the interface 1112 may be made from a different electrically conductive material than that at the interface (e.g., where a noble metal is used at the interface 1112, and a less expensive non-noble metal, such as tungsten, may be used to form the remainder of the control gate 110).

In various embodiments, the presence of the interface 1112 between the blocking dielectric 1108 and the control gate 1110 that substantially prevents oxygen diffusion from the blocking dielectric 1108 into the control gate 1110 and thus prevents the formation of an oxygen containing interdiffused region in the metal control gate. This may be advantageous for at least the following reasons. In some embodiments the substantially oxygen diffusion free interface 1112 prevents or reduces current leakage between the control gate 1110 and the charge storage region 1106 through the blocking dielectric 1108. The interface 1112 may also increase the breakdown voltage of the blocking dielectric 1108 in comparison to the case where oxygen diffusion is present. The interface 1112 may also improve adhesion between the blocking dielectric 1108 into the control gate 1110.

In various embodiments, one or more of the forgoing advantageous effects may result in improved performance of the memory device 1100. In some embodiments, one or more of the forgoing advantageous effects may result in an increase in program/erase (PE) window of the device 1100 (i.e. the voltage threshold window that separates the programmed state of the device from an erased state of the device). In some embodiments, the memory device 1100 may experience decreased degradation of the PE over time (e.g., over a number of program/erase cycles). In some embodiments, one or more of the forgoing advantageous effects may result in increased reliability of the memory device 1100, e.g., a lower chance of device failure over time (e.g., over a number of program/erase cycles).

In some embodiments, the blocking dielectric layer 1108 may include a stack of multiple layers. For example, as shown in FIG. 1B the blocking dielectric 1108 contains a first layer 1108a (e.g. an aluminum oxide layer) below the interface 1112 and a second layer 1108b (e.g., a hafnium oxide layer) below the first layer 1108a. For example, as shown, the blocking dielectric 1108 includes a first hafnium oxide layer 1108b located over the charge storage region 1106 and a first aluminum oxide layer 1108a located over the first hafnium oxide layer 1108b.

Some embodiments may include an optional electrically insulating barrier layer 1114 (e.g., an oxynitride layer such as hafnium oxynitride) located at the interface 1112 between the blocking dielectric 1108 and the control gate 1110. In some embodiments (e.g., as shown), the barrier layer 1114 may contact the first aluminum oxide layer 1108a. In some embodiments, the barrier layer 1114 is an oxynitride (such as hafnium oxynitride) that contains, e.g., between 1 and 10 atomic percent nitrogen or any sub-range thereof, such as between 2 and 5 atomic percent nitrogen.

Figure 1C:
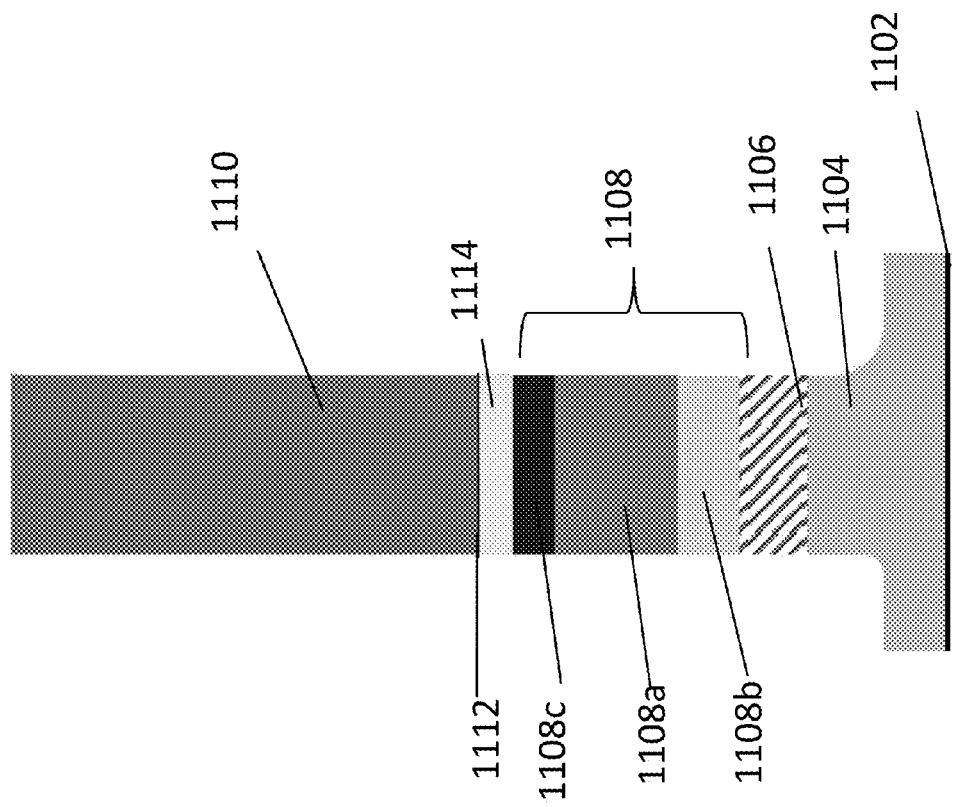

In some embodiments, the blocking dielectric 1108 may include additional layers. For example, as shown in FIG. 1C, the blocking dielectric 1108 includes a first hafnium oxide layer 108b located over the charge storage region 1106, a first aluminum oxide layer 1108a located over the first hafnium oxide layer 1108b, and a second hafnium oxide layer 1108c located between the interface 1112 (e.g., including the oxynitride barrier layer 1114) and the first aluminum oxide layer 1108a.

Figure 2:
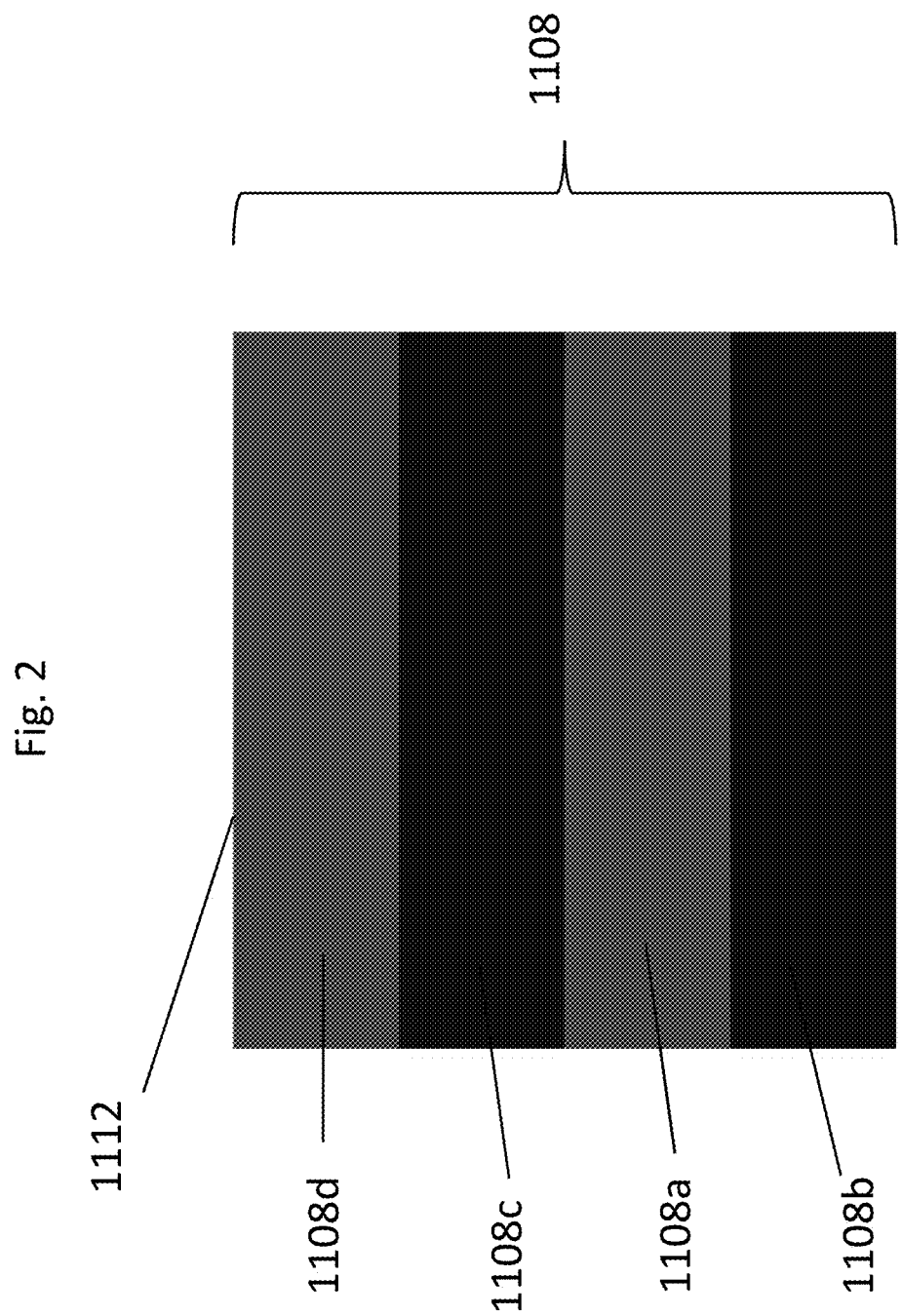
FIG. 2 shows a detailed cross sectional side view of a blocking dielectric for a memory device.

In general, in various embodiments, the blocking dielectric 1108 may include any suitable number of alternating hafnium oxide and aluminum oxide layers. For example, FIG. 2 shows a detailed view of a blocking dielectric 108 that includes a first hafnium oxide layer 1108b located over the charge storage region 1106 (not shown) and a first aluminum oxide layer 1108a located over the first hafnium oxide layer 1108b, a second aluminum oxide barrier layer 1108d located at the interface 1112 between the blocking dielectric and the control gate 1110 (not shown), and a second hafnium oxide layer 1108c located between the second aluminum oxide barrier layer 1108d and the first aluminum oxide layer 1108a. In this embodiment, layer 1108d acts the insulating barrier layer.

As shown in FIG. 1D, alternative embodiments of the memory device 1100 include an electrically conductive barrier layer 1120 located at the interface between the blocking dielectric 1108 and the control gate 1110. In some embodiments the barrier layer 1120 may be a silicide nitride barrier layer, such as a titanium silicide nitride. In some embodiments, the silicide nitride barrier layer 1120 contains, e.g., between 1 and 20 atomic percent silicon or any subrange thereof, such as 5 and 15 atomic percent silicon. In some embodiments, the silicide nitride barrier layer 1120 contains, e.g., between 25 and 50 atomic percent nitrogen and titanium each, or any sub-range thereof, such as between 35 and 45 atomic percent nitrogen. In some embodiments, the barrier layer 1120 is thinner than the blocking dielectric 1108, e.g., having a thickness in the range of 1-50 nm or any subrange thereof, such as 1-20 nm, 1-10 nm, or 1-5 nm.

As shown in FIG. 1E, in some embodiments, the memory device 1100 may include molybdenum, a molybdenum alloy, a noble metal or a noble metal alloy located at the interface 1112 between the blocking dielectric 1108 and the control gate 1110. For example, in some embodiments the control gate 1110 includes molybdenum or a noble metal, and the molybdenum, molybdenum alloy, noble metal or noble metal alloy located at the interface 1112 between the blocking dielectric and the control gate comprises a bottom 1110a of the control gate 1110.

The molybdenum, molybdenum alloy, a noble metal, or noble metal alloy materials may be advantageous in that they may exhibit lower electrical resistivity than conventional gate electrode materials, such as tungsten. The aforementioned materials may also be stable at relatively high temperatures, e.g., reducing or eliminating oxidation at the interface 1112 that might otherwise occur, e.g., during thermal processing such as an annealing step. In some embodiments, these materials may be deposited directly only the blocking dielectric 1108 without the need for a diffusion barrier layer. For example, these materials may be deposited directly onto a hafnium oxide top layer of the blocking dielectric 1108. Furthermore, these materials may have a higher etch selectively to oxides than conventional materials, such as tungsten. The etch byproducts of these materials may be more volatile than those for conventional materials, such as tungsten, reducing or eliminating contamination concerns during processing.

It is to be understood that various embodiments of the memory device 1100 may include any suitable combination of the elements and features shown in FIGS. 1A-1E. For example, some embodiments may include both the electrically conductive barrier layer 1120 as shown in FIG. 1D, and the molybdenum, a molybdenum alloy, a noble metal or a noble metal alloy control gate portion 1110a located at the interface 1112, as shown in FIG. 1E.

Figure 3A:

FIGS. 3A-3D illustrate process steps in a method of making a memory device 1100 of the type shown in FIGS. 1A-1E. Referring to FIG. 3A, in a first step 3301, a tunnel dielectric 1104 is formed over a semiconductor channel 1102. The semiconductor channel 1102 may include any suitable type of semiconductor material, such as silicon. In some embodiments the semiconductor channel 1102 may include a region of doped semiconductor material of a first conductivity type disposed between source and drain regions (not shown) of semiconductor material having a second conductivity type that differs from the first. For example, the semiconductor channel 1102 may be n-type doped semiconductor while the source and drain regions are p-type semiconductor material (or vice versa). In some embodiments, the semiconductor channel 1102 may be formed in a substrate, such as a silicon wafer substrate.

The tunnel dielectric 1104 may be formed from any suitable insulating material, such as an oxide (e.g., $SiO_2$). For example, in some embodiments, the tunnel dielectric 1104 may include a silicon oxide, a nitride silicon oxide or silicon oxide/silicon nitride layer stack. In some embodiments the tunnel dielectric 104 is formed with a thickness selected to allow for quantum tunneling of charge carriers (e.g., Fowler-Nordheim tunneling or hot carrier injection) between the charge storage region 1106 and the semiconductor channel 1104 (e.g., in the presence of an applied voltage) to allow for programming and erasing the memory device 1100.

The tunnel dielectric 1104 may be formed using may be formed using any suitable technique including sputtering, chemical vapor deposition, physical vapor deposition, plasma enhanced chemical vapor deposition, etc.

Figure 3B:
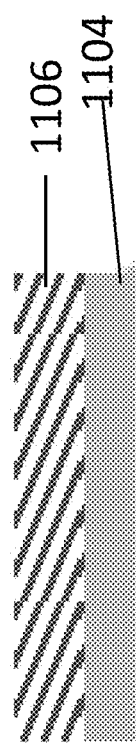

Referring to FIG. 3B, in a next step 3302, a charge storage region 1106 is formed over the tunnel dielectric. The charge storage region 1106 may include any suitable charge storage material. For example, in some embodiments, the charge storage region 1106 includes polycrystalline silicon, metal, metal silicide or silicon nitride. In some embodiments, the charge storage region 1106 may operate as a floating gate for the memory device 1100. As noted above, in some embodiments, the charge storage state of the charge storage region 1106 may be programmed by applying an electric field to the region to cause tunneling of charge carriers into or out of the charge storage region 1106.

The charge storage region 1106 may be formed using may be formed using any suitable technique including sputtering or chemical vapor deposition, physical vapor deposition, plasma enhanced chemical vapor deposition, etc. .

Figure 3C:
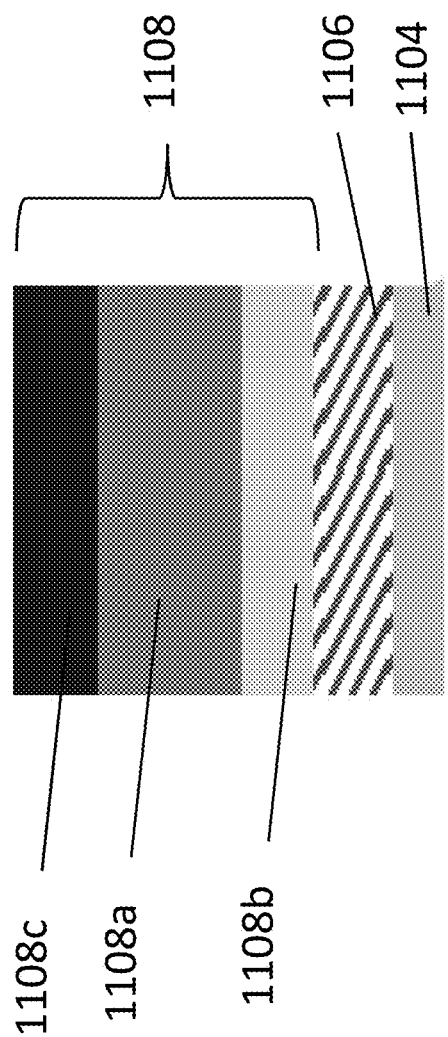

Referring to FIG. 3C, in a next step 3303, a blocking dielectric 1108 is formed over the charge storage region 1106. The blocking dielectric 1108 may be any suitable materially that electrically insulates the charge storage region 1106 from the control gate 1110. As described in detail below, the blocking dielectric 1108 may include one or more oxides, such as metal oxides (e.g., $HfO_2$ and/or $Al_2O_3$).

The blocking dielectric 1108 may be formed using may be formed using any suitable technique including sputtering or chemical vapor deposition, physical vapor deposition, plasma enhanced chemical vapor deposition, etc.

Figure 3D:
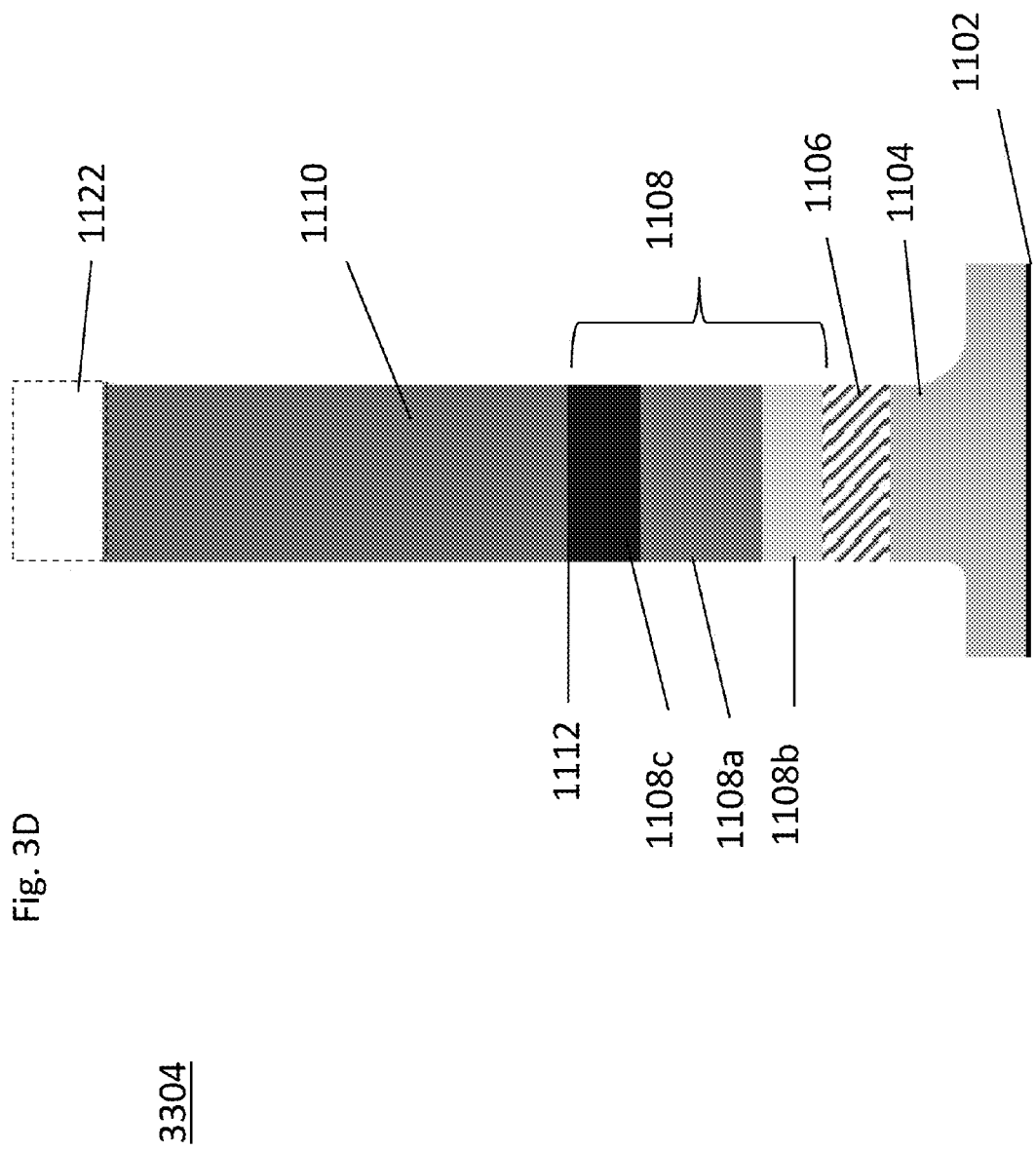

Referring to FIG. 3D, in a next step 3304, a control gate 1110 is formed over the blocking dielectric 1108. The control gate 1110 may include an electrically conductive material (e.g., a metal, metal alloy, or metal silicide) in contact with the blocking dielectric 1108 at the interface 1112. In some embodiments, the control gate 1110 may include for example, tungsten, a tungsten alloy, molybdenum, a molybdenum alloy, a noble metal or a noble metal alloy in region 1110a or in the entire gate.

In some embodiments, the layer structure described above may be patterned, e.g., to form an array of pillar or rail structures each comprising a memory device 1100. For example, a patterned mask 1122 (e.g., a hard mask and/or photoresist) may be formed using photolithography and etching that exposes only portions of the underlying structure intended for removal. An etching process may then be used to remove exposed portions of the layer stack to define the array of devices. The mask may then be removed, e.g., by using a chemical mechanical polishing process or etching for a hardmask, or ashing for a photoresist to expose a top surface of the array.

As detailed herein with reference to FIG. 1E, the control gate 1110 may include molybdenum, a molybdenum alloy, a noble metal or a noble metal alloy located at the interface 1112 between the blocking dielectric 1108 and the control gate 1110. In some embodiments, the portion a of the control gate 1110 extending away from the interface 1112 may be made from a different electrically conductive material (e.g., where a noble metal is used in region 1110a at the interface 1112, a less expensive non-noble metal such as tungsten may be used to form the remainder of the control gate 1110). This structure may be formed by depositing a noble metal layer or noble metal nanodots (i.e., nanoparticles) 1110a (e.g., Pt, Pd, Au, Rh or Ru layer or nanoparticles) over the interface followed by depositing a tungsten control gate 1110 material over the noble metal layer 1110a. A method of depositing noble metal nanoparticles is described in U.S. application Ser. No. 13/708,587 filed on Dec. 7, 2012 and incorporated herein by reference in its entirety.

The control gate 1110 layer or layers may be formed using may be formed using any suitable technique including sputtering or chemical vapor deposition, physical vapor deposition, plasma enhanced chemical vapor deposition, etc.

The structure formed in step 304 corresponds to the memory device 1100 shown in FIGS. 1A-1E. The memory device 1100 includes an interface 1112 between the blocking dielectric and the control gate substantially prevents oxygen diffusion from the blocking dielectric into the control gate. As detailed above, the interface 1112 provides a variety of advantageous effects in various embodiments.

The method shown above may optionally include various optional sub-steps. For example, in some embodiments, step 3303 includes forming a blocking dielectric 1108 that contains at least one metal oxide layer 1108a below the interface, e.g., as shown in FIGS. 1A-1D.

For example, in some embodiments, the step of 3303 of forming the blocking dielectric 108 includes forming a first hafnium oxide 1108b layer located over the charge storage region 106 and forming a first aluminum oxide layer 1108a located over the first hafnium oxide layer 1108b, as shown in FIG. 3C.

In some embodiments, the step of 3303 of forming the blocking dielectric 1108 includes forming more than two layers. For example, as shown in FIG. 3C, forming the blocking dielectric 1108 may include forming a first hafnium oxide layer 1108b over the charge storage region 1106, forming a first aluminum oxide layer 1108a over the first hafnium oxide layer 1108b, forming a second hafnium oxide layer 1108c over the first aluminum oxide layer 1108a, followed by forming the insulating barrier layer 1114 or 1108d described above.

For example, as described above, the insulating barrier layer 1114 may be an oxynitride (such as hafnium oxynitride) that contains, e.g., between 1 and 10 atomic percent nitrogen or any sub-range thereof, such as between 2 and 5 atomic percent nitrogen. When the top layer of the blocking dielectric 1108 is a hafnium oxide layer (e.g., layer 1108c, as shown in FIG. 3C) then the hafnium oxynitride barrier layer 1114 may be formed by nitriding at least an upper surface of the hafnium oxide layer 1108c in a nitrogen (e.g., molecular nitrogen or ammonia) containing ambient or plasma. Alternatively, a hafnium oxynitride barrier layer 1114 may be deposited by chemical or physical vapor deposition over the hafnium oxide layer 1108c.

In general, in various embodiments, the step 3303 of forming the blocking dielectric 1018 may include forming any suitable number of alternating hafnium oxide and aluminum oxide layers. For example, as shown in FIG. 2 the first hafnium oxide layer 1108b is formed over the charge storage region 106 (not shown), first aluminum oxide layer 108a is formed over the first hafnium oxide layer 108b, a second hafnium oxide layer 108c is formed over the first aluminum oxide layer 1108a and the second aluminum oxide barrier layer 1108d is formed at the interface 1112 over the second hafnium oxide layer 108.

Referring to FIGS. 3E and 3F, some embodiments include an additional step 3305 of forming the conductive barrier layer 1120 over blocking dielectric 1108 at the interface 1112. In some embodiments the barrier layer 1210 may be a silicide nitride barrier layer, such as a titanium silicide nitride layer. In some embodiments, the silicide nitride barrier layer 1120 contains, e.g., between 1 and 20 atomic percent silicon, or any subrange thereof, such as 5 and 15 atomic percent silicon. In some embodiments, the silicide nitride barrier layer 120 contains, e.g., between 25 and 50 atomic percent each of titanium and nitrogen or any sub-range thereof, such as between 35 and 45 atomic percent each of titanium and nitrogen. In some embodiments, the barrier layer 1120 is thinner than the blocking dielectric 108, e.g., having a thickness in the range of 1-50 nm or any subrange thereof, such as 1-20 nm, 1-10 nm, or 1-5 nm.

In some embodiments the titanium silicide nitride barrier layer 1120 is formed by depositing a titanium nitride layer 1120a over the blocking dielectric 1108. In some embodiments, the titanium nitride layer 1120a is formed using atomic layer deposition. This is followed by depositing an amorphous silicon layer 1120b over the titanium nitride layer using physical vapor deposition. In some embodiments, the titanium nitride layer 1120a has a thickness of, e.g., 1 to 20 nm, such as 5 to 10 nm and the amorphous silicon layer 1120b has a thickness of 1 to 10 nm, such as 1 to 2 nm. The barrier layer 1120 is formed by reacting the titanium nitride layer 1120a with the amorphous silicon layer 1120b to form the titanium silicide nitride barrier layer 1120 as shown. The step of reacting may comprise heating the layers at a suitable temperature, e.g., 350-500 C, such as 400-450 C for 10 to 60 minutes, such as 30-45 minutes. In some embodiments, the step of reacting the titanium nitride layer 1120a with the amorphous silicon layer 1120b includes heating the titanium nitride layer 1120a and the amorphous silicon layer 1120b after forming a tungsten control gate layer 1110 (e.g., by CVD or sputtering) on the amorphous silicon layer 1120b to keep the tungsten control gate layer resistance to its lowest possible value.

Various embodiments may include any suitable additional processing steps. For example, some embodiments may include one or more annealing steps (e.g., to anneal polysilicon, metal, metal silicide or silicon nitride material used form the charge storage region 106).

In various embodiments, one or more of the memory devices 1100 of the type described above may be used as storage elements in a non-volatile memory device such as an EEPROM or flash memory device.

Figure 4B:
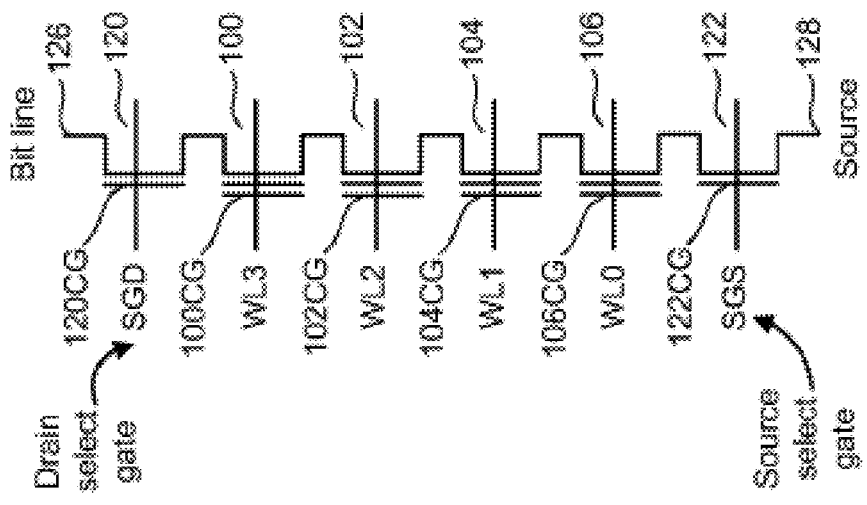
FIG. 4B shows an equivalent circuit diagram from the NAND string of FIG. 4A.
Figure 4A:
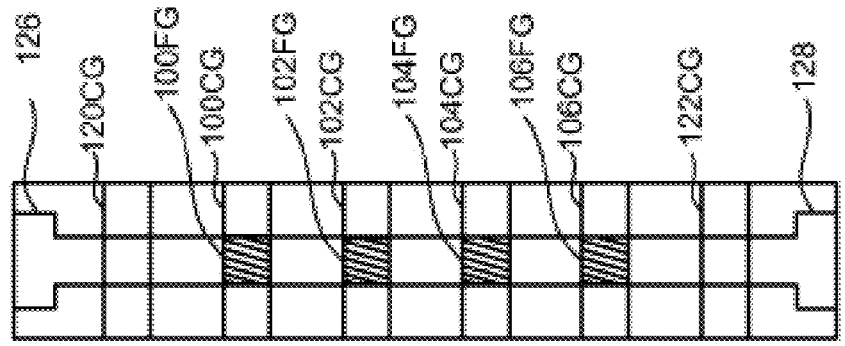
FIG. 4A shows a schematic of a NAND string.

One example of a memory system which may include memory devices 100 as described herein is a NAND flash memory structure, which includes multiple transistors arranged in series between two select gates. The transistors in series and the select gates are referred to as a NAND string. FIG. 4A is a top view showing one NAND string. FIG. 4B is an equivalent circuit thereof. The NAND string depicted in FIGS. 4A and 4B includes four transistors, 100, 102, 104 and 106, in series and sandwiched between a first select gate 120 and a second select gate 122. Select gate 120 gates the NAND string connection to bit line 126. Select gate 122 gates the NAND string connection to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to (or is) word line WL3, control gate 102CG is connected to word line WL2, control gate 104CG is connected to word line WL1, and control gate 106CG is connected to word line WL0. In one embodiment, transistors 100, 102, 104 and 106 are each storage elements, also referred to as memory cells. In other embodiments, the storage elements may include multiple transistors or may be different than that depicted in FIGS. 4A and 4B. Select gate 120 is connected to select line SGD. Select gate 122 is connected to select line SGS.

One or more of the transistors 100, 102, 104 and 106 may be implemented as a memory cell 1100 as the type shown in FIGS. 1A-1E above. The channel of each transistor may include the semiconductor channel 1102 of the memory device 1100. The floating gate of the transistor may include the charge storage region 1106 of the memory device 1100. The control gate of each transistor may include the control gate 1110 memory device 1100.

Figure 5:
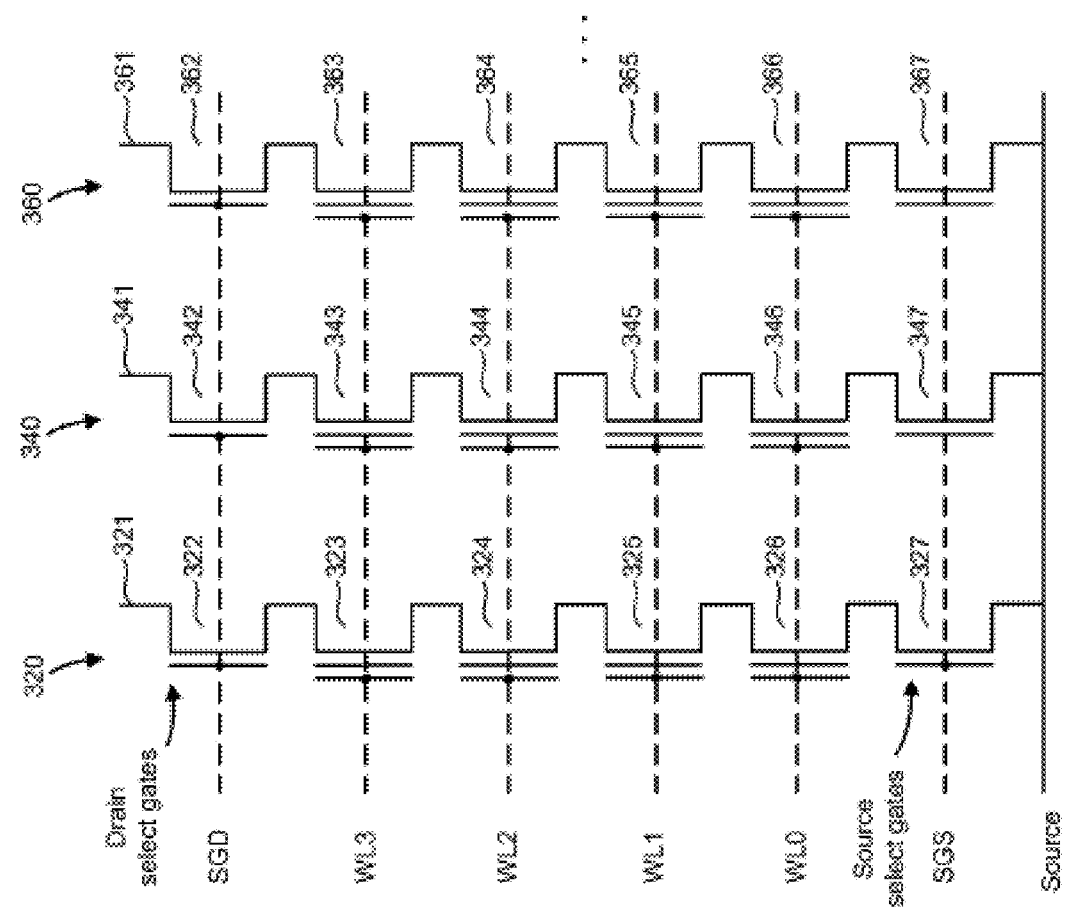
FIG. 5 is a circuit diagram depicting three NAND strings.

FIG. 5 is a circuit diagram depicting three NAND strings. A typical architecture for a flash memory system using a NAND structure will include several NAND strings. For example, three NAND strings 320, 340 and 360 are shown in a memory array having many more NAND strings. Each of the NAND strings includes two select gates and four storage elements, each of which may include a memory device 1100 of the type described with reference to FIGS. 1A-1E. While four storage elements are illustrated for simplicity, modern NAND strings can have up to thirty-two or sixty-four storage elements, for instance.

For example, NAND string 320 includes select gates 322 and 327, and storage elements 323-326, NAND string 340 includes select gates 342 and 347, and storage elements 343-346, NAND string 360 includes select gates 362 and 367, and storage elements 363-366. Each NAND string is connected to the source line by its select gates (e.g., select gates 327, 347 or 367). A selection line SGS is used to control the source side select gates. The various NAND strings 320, 340 and 360 are connected to respective bit lines 321, 341 and 361, by select transistors in the select gates 322, 342, 362, etc. These select transistors are controlled by a drain select line SGD. In other embodiments, the select lines do not necessarily need to be in common among the NAND strings; that is, different select lines can be provided for different NAND strings. Word line WL3 is connected to the control gates for storage elements 323, 343 and 363. Word line WL2 is connected to the control gates for storage elements 324, 344 and 364. Word line WL1 is connected to the control gates for storage elements 325, 345 and 365. Word line WL0 is connected to the control gates for storage elements 326, 346 and 366. As can be seen, each bit line and the respective NAND string comprise the columns of the array or set of storage elements. The word lines (WL3, WL2, WL1 and WL0) comprise the rows of the array or set. Each word line connects the control gates of each storage element in the row. Or, the control gates may be provided by the word lines themselves. For example, word line WL2 provides the control gates for storage elements 324, 344 and 364. In practice, there can be thousands of storage elements on a word line.

Each storage element can store data. For example, when storing one bit of digital data, the range of possible threshold voltages ($V_{TH}$) of the storage element is divided into two ranges which are assigned logical data "1" and "0." In one example of a NAND type flash memory, the $V_{TH}$ is negative after the storage element is erased, and defined as logic "1." The $V_{TH}$ after a program operation is positive and defined as logic "0." When the VTH is negative and a read is attempted, the storage element will turn on to indicate logic "1" is being stored. When the VTH is positive and a read operation is attempted, the storage element will not turn on, which indicates that logic "0" is stored. A storage element can also store multiple levels of information, for example, multiple bits of digital data. In this case, the range of $V_{TH}$ value is divided into the number of levels of data. For example, if four levels of information are stored, there will be four $V_{TH}$ ranges assigned to the data values "11", "10", "01", and "00." In one example of a NAND type memory, the VTH after an erase operation is negative and defined as "11". Positive $V_{TH}$ values are used for the states of "10", "01", and "00." The specific relationship between the data programmed into the storage element and the threshold voltage ranges of the element depends upon the data encoding scheme adopted for the storage elements. For example, U.S. Pat. Nos. 6,222,762 and 7,237,074, both of which are incorporated herein by reference in their entirety, describe various data encoding schemes for multi-state flash storage elements.

Relevant examples of NAND type flash memories and their operation are provided in U.S. Pat. Nos. 5,386,422, 5,570,315, 5,774,397, 6,046,935, 6,456,528 and 6,522,580, each of which is incorporated herein by reference in their entirety.

When programming a flash storage element, a program voltage is applied to the control gate of the storage element, and the bit line associated with the storage element is grounded. Electrons from the channel are injected into the floating gate. When electrons accumulate in the floating gate, the floating gate becomes negatively charged and the $V_{TH}$ of the storage element is raised. To apply the program voltage to the control gate of the storage element being programmed, that program voltage is applied on the appropriate word line. As discussed above, one storage element in each of the NAND strings share the same word line. For example, when programming storage element 324 of FIG. 5, the program voltage will also be applied to the control gates of storage elements 344 and 364.

FIG. 6 depicts a cross-sectional view of an exemplary NAND string 400 formed on a substrate. The view is simplified and not to scale. The NAND string 400 includes a source-side select gate 406, a drain-side select gate 424, and eight storage elements 408, 410, 412, 414, 416, 418, 420 and 422, formed on a substrate 490. Each of the storage elements 408, 410, 412, 414, 416, 418, 420 and 422 comprise a memory device 1100 of the type described herein. Each of the memory devices include a semiconductor channel, a tunnel dielectric located over the semiconductor channel, a charge storage region (e.g., a floating gate) located over the tunnel dielectric, a blocking dielectric located over the charge storage region, and a control gate located over the blocking dielectric. An interface is formed between the blocking dielectric and the control gate substantially prevents oxygen diffusion from the blocking dielectric into the control gate. In the interest of clarity, these elements of memory device 1100 are not explicitly shown in FIG. 6, but in various embodiments, may be configured as shown in FIGS. 1A-1E.

A number of source/drain regions, one example of which is source drain/region 430, are provided on either side of each storage element and the select gates 406 and 424. In one approach, the substrate 490 employs a triple-well technology that includes a p-well region 492 within an n-well region 494, which in turn is within a p-type substrate region 496. The NAND string and its non-volatile storage elements can be formed, at least in part, on the p-well region 492. For example, the semiconductor channel for each storage element may comprise a portion of the a p-well region 492. Of course, in other embodiment, the conductivity types of the regions 492, 494, and 496 may be reversed.

The control gate of each of the storage elements 408, 410, 412, 414, 416, 418, 420 and 422 may comprise or be in electrical contact with a respective one of the conductive word lines WL0, WL1, WL2, WL3, WL4, WL5, WL6 and WL7 of the NAND device 400.

A source supply line 404 with a potential of Vsource (Vsrc) is provided in addition to a bit line 426 with a potential of Vb1. In one possible approach, a voltage Vp-well can be applied to the p-well region 492 via a terminal 402. A voltage Vn-well can also be applied to the n-well region 494 via a terminal 403. A body bias can be expressed by V-pwell-Vsource or Vn-well-Vsource.

During a sensing operation such as a read or verify operation, including an erase-verify operation, in which the condition of a storage element, such as its Vth, is ascertained, a control gate voltage is provided on a selected word line which is associated with a selected storage element. Further, the control gate of a storage element may be provided as a portion of the word line. For example, WL0, WL1, WL2, WL3, WL4, WL5, WL6 and WL7 can extend via the control gates of storage elements 408, 410, 412, 414, 416, 418, 420 and 422, respectively.

In various embodiments, the operation of the NAND cell 400 may operate using the techniques described in, for example, U. S. Pat. No. 8,441,853 granted May 14, 2013 entitled "Sensing for NAND memory based on word line position"; and U.S. Pat. No. 8,638,606 granted Jan. 28, 2014 entitled "Substrate bias during program of non-volatile storage" each of which are incorporated herein by reference in their entirety.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A memory device, comprising:
   a semiconductor channel;
   a tunnel dielectric located over the semiconductor channel;
   a charge storage region located over the tunnel dielectric;
   a blocking dielectric located over the charge storage region; and
   a control gate located over the blocking dielectric;
   wherein an interface between the blocking dielectric and the control gate substantially prevents oxygen diffusion from the blocking dielectric into the control gate;
   wherein the blocking dielectric contains at least one metal oxide layer below the interface;
   wherein the blocking dielectric comprises a first hafnium oxide layer located over the charge storage region and a first aluminum oxide layer located over the first hafnium oxide layer; and
   further comprising at least one of (a), (b), (c), (d) or (e):
   (a) further comprising a hafnium oxynitride barrier layer located at the interface between the blocking dielectric and the control gate, wherein the hafnium oxynitride barrier layer contacts the first aluminum oxide layer;
   (b) further comprising a hafnium oxynitride barrier layer located at the interface between the blocking dielectric and the control gate, and a second hafnium oxide layer located between the hafnium oxynitride barrier layer and the first aluminum oxide layer;
   (c) further comprising a hafnium oxynitride barrier layer located at the interface between the blocking dielectric and the control gate, wherein the hafnium oxynitride barrier layer contains between 2 and 5 atomic percent nitrogen;

(d) further comprising a second aluminum oxide barrier layer located at the interface between the blocking dielectric and the control gate; or (e) further comprising a titanium silicide nitride barrier layer located at the interface between the blocking dielectric and the control gate.

2. The device of claim 1, wherein the step of further comprising at least one of (a), (b), (c), (d) or (e) includes the hafnium oxynitride barrier layer located at the interface between the blocking dielectric and the control gate.

3. The device of claim 2, wherein the hafnium oxynitride barrier layer contacts the first aluminum oxide layer.

4. The device of claim 2, further comprising a second hafnium oxide layer located between the hafnium oxynitride barrier layer and the first aluminum oxide layer.

5. The device of claim 2, wherein the hafnium oxynitride barrier layer contains between 2 and 5 atomic percent nitrogen.

6. The device of claim 1, wherein the step of further comprising at least one of (a), (b), (c), (d) or (e) comprises the second aluminum oxide barrier layer located at the interface between the blocking dielectric and the control gate.

7. The device of claim 6, further comprising a second hafnium oxide layer located between the second aluminum oxide barrier layer and the first aluminum oxide layer.

8. The device of claim 1, wherein the step of further comprising at least one of (a), (b), (c), (d) or (e) comprises the titanium silicide nitride barrier layer located at the interface between the blocking dielectric and the control gate.

9. The device of claim 8, wherein the titanium silicide nitride barrier layer contains between 5 and 15 atomic percent silicon.

10. A method of making a memory device, comprising:
forming a tunnel dielectric over a semiconductor channel;
forming a charge storage region over the tunnel dielectric;
forming a blocking dielectric over the charge storage region; and
forming a control gate over the blocking dielectric;
wherein an interface between the blocking dielectric and the control gate substantially prevents oxygen diffusion from the blocking dielectric into the control gate;
wherein the blocking dielectric contains at least one metal oxide layer below the interface;
wherein the blocking dielectric comprises a first hafnium oxide layer located over the charge storage region and a first aluminum oxide layer located over the first hafnium oxide layer; and
further comprising at least one of (a), (b), (c) or (d):
(a) further comprising forming a hafnium oxynitride barrier layer at the interface between the blocking dielectric and the control gate, wherein the hafnium oxynitride barrier layer is formed by nitriding at least an upper surface of a second hafnium oxide layer located over the first aluminum oxide layer;

(b) further comprising forming a hafnium oxynitride barrier layer at the interface between the blocking dielectric and the control gate, wherein the hafnium oxynitride barrier layer contains between 2 and 5 atomic percent nitrogen;

(c) further comprising forming a second aluminum oxide barrier layer at the interface between the blocking dielectric and the control gate; or (d) further comprising forming a titanium silicide nitride barrier layer at the interface between the blocking dielectric and the control gate.

11. The method of claim 10, wherein the step of further comprising at least one of (a), (b), (c) or (d) includes forming the hafnium oxynitride barrier layer at the interface between the blocking dielectric and the control gate.

12. The method of claim 11, wherein the hafnium oxynitride barrier layer is formed by nitriding at least an upper surface of a second hafnium oxide layer located over the first aluminum oxide layer.

13. The method of claim 11, wherein the hafnium oxynitride barrier layer contains between 2 and 5 atomic percent nitrogen.

14. The method of claim 10, wherein the step of further comprising at least one of (a), (b), (c) or (d) comprises forming the second aluminum oxide barrier layer at the interface between the blocking dielectric and the control gate.

15. The method of claim 14, further comprising forming a second hafnium oxide layer between the second aluminum oxide barrier layer and the first aluminum oxide layer.

16. The method of claim 10, wherein the step of further comprising at least one of (a), (b), (c) or (d) comprises forming the titanium silicide nitride barrier layer at the interface between the blocking dielectric and the control gate.

17. The method of claim 16, wherein the titanium silicide nitride barrier layer contains between 5 and 15 atomic percent silicon.

18. The method of claim 16, wherein the titanium silicide nitride barrier layer is formed by depositing a titanium nitride layer over the blocking dielectric, depositing an amorphous silicon layer over the titanium nitride layer, and reacting the titanium nitride layer with the amorphous silicon layer to form the titanium silicide nitride barrier layer.

19. The method of claim 18, wherein the step of reacting comprises heating the titanium nitride layer and the amorphous silicon layer after forming a tungsten control gate layer on the amorphous silicon layer to keep the tungsten control gate layer resistance to its lowest possible value.

20. The method of claim 19, wherein the titanium nitride layer has a thickness of 5 to 10 nm and the amorphous silicon layer has a thickness of 1 to 2 nm.

* * * * *